(12) United States Patent
Figura et al.

(10) Patent No.: US 6,255,687 B1
(45) Date of Patent: Jul. 3, 2001

(54) DOPED SILICON STRUCTURE WITH IMPRESSION IMAGE ON OPPOSING ROUGHENED SURFACES

(75) Inventors: Thomas A. Figura, Boise; Zhiquiang Wu; Li Li, both of Meridian, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/407,335

(22) Filed: Sep. 29, 1999

Related U.S. Application Data (62) Division of application No. 08/818,229, filed on Mar. 14, 1997, now Pat. No. 5,963,804.

(51) Int. Cl.[7] .......................... H01L 27/108; H01L 29/76; H01L 29/94; H01L 31/119
(52) U.S. Cl. ........................ 257/309; 257/306; 257/303
(58) Field of Search .................................. 257/309, 308, 257/306, 304, 303, 311; 438/255, 964, 764, 253, 254, 256, 381, 396–399

(56) References Cited

U.S. PATENT DOCUMENTS

| | | | |
|---|---|---|---|
| 4,093,503 | 6/1978 | Harris et al. | 156/628 |
| 4,571,817 | 2/1986 | Birritella et al. | 29/576 B |
| 5,340,765 | * 8/1994 | Dennison et al. | 437/52 |
| 5,358,908 | 10/1994 | Reinberg et al. | 437/228 |
| 5,484,740 | 1/1996 | Cho | 437/40 |
| 5,554,557 | 9/1996 | Koh | 437/52 |
| 5,658,381 | 8/1997 | Thakur et al. | 257/309 |

OTHER PUBLICATIONS

U. Schnakenberg et al., TMAHW Etchants For Silicon Micromachining, 91 CH2817–5/91/000–0815, IEEE, 815–818, 1991.

G.L. Kuhn et al., Thin Silicon Film on INsulating Substrate, J. Electrochem. Soc. Solid State Science and Technology, Vol. 120, No. 11, 1563–1566, 1973.

* cited by examiner

Primary Examiner—Steven Loke
Assistant Examiner—Douglas W. Owens
(74) Attorney, Agent, or Firm—Workman, Nydegger & Seeley (57) ABSTRACT

A silicon structure is formed that includes a free-standing wall having opposing roughened inner and outer surfaces using ion implantation and an unimplanted silicon etching process which is selective to implanted silicon. In general, the method provides a recess in a layer of insulating material into which a polysilicon layer is formed. A layer of HSG or CSG polysilicon is subsequently formed on the polysilicon layer, after which ions are implanted into both the layer of HSG or CSG polysilicon and the underlying polysilicon layer. The aforementioned selective etching process is then conducted to result in a relatively unimplanted portion being etched away and a highly implanted portion being left standing to form the free-standing wall. The free-standing wall has an inner surface that is roughened by the layer of HSG or CSG polysilicon. The free-standing wall also has a roughened outer surface to which has been transferred a near-impression image topography of the opposing inner surface. The near-impression image topography of the outer and inner surfaces are due to the grains of the layer of HSG or CSG polysilicon which, during ion implantation and selective etching, transfer the topography of the inner surface to the outer surface so as to also roughened the outer surface. One preferred etching process uses an etchant comprising a selected volume of tetramethyl ammonium hydroxide in solution, which etches unimplanted silicon up to 60 times faster than implanted silicon. A capacitor storage node formed with the method has an increased surface area electrically connected with an underlying silicon substrate.

15 Claims, 5 Drawing Sheets

DOPED SILICON STRUCTURE WITH IMPRESSION IMAGE ON OPPOSING ROUGHENED SURFACES

This application is a divisional application of U.S. patent application Ser. No. 08/818,229, filed Mar. 14, 1997, now U.S. Pat. No. 5,963,804, which is incorporated herein by reference.

BACKGROUND OF THE INVENTION

1. The Field of the Invention

The present invention relates to methods for forming silicon structures. More particularly, the present invention relates to methods for forming a silicon structure of increased surface area by forming roughened surfaces on opposite sides of the silicon structure. The present invention is also directed to a capacitor having capacitor plates that similarly have an increased surface area on opposite sides thereof

2. The Relevant Technology

Integrated circuits are found on microchips and provide the logic and memory of computers and other such intelligent electronic devices. These integrated circuits are now being formed with an improved efficiency that has made computers and other intelligent electronic devices more affordable. Continual progress in integrated circuit manufacturing processes has also led to an increasingly smaller scale and a greater functionality of intelligent electronic devices.

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The conventional semiconductor devices which are formed on the semiconductor wafer include capacitors, resistors, transistors, diodes, and the like. In advanced manufacturing of integrated circuits, hundreds of thousands of these semiconductor devices are formed on a single semiconductor wafer.

The computer and electronics industry is constantly under market demand to increase the speed at which integrated circuits operate, to increase the capabilities of integrated circuits, and to reduce the cost of integrated circuits. One manner of accomplishing this task is to increase the density with which the semiconductor devices can be formed on a given surface area of a single semiconductor wafer. In so doing, the semiconductor devices must be decreased in dimension in a process known as miniaturization. In order to meet market demands and further the miniaturization of integrated circuits, the processes by which the semiconductor devices are formed are in need of improvement.

The capacitor is a structure which is frequently formed in integrated circuit manufacturing and for which an improved method of formation is needed. The capacitor is formed with a storage node, a cell plate, and an intervening dielectric layer. The storage node and the cell plate are typically patterned out of polysilicon by conventional photolithography and dry etching. The dielectric layer is formed in an intervening process between the formation of the storage node and the cell plate, typically by chemical vapor deposition (CVD) of silicon nitride through exposure of the polysilicon of the storage node to oxygen at an elevated temperature.

An important consideration in forming capacitors in integrated circuits is surface area. A large surface area of the storage node and cell plate is necessary in order to provide high capacitance and therefore optimal performance of the capacitor. Balanced against this need is the competing requirement that the capacitor also occupy a minimum of space on the silicon substrate of a semiconductor wafer on which the capacitor is formed. One manner in which the semiconductor industry has approached minimal space capacitor formation is to form the capacitor at a significant distance above the silicon substrate. When so doing, one of the storage node and the cell plate are typically wrapped around the other, forming what is known as a stacked capacitor.

While the use of stacked capacitors has effectively increased capacitor surface area, one further problem common with the various configurations of stacked capacitors and the processes used to form them is that the processes are generally complicated and lengthy, thereby increasing the opportunities for defect conditions to occur and driving up integrated circuit manufacturing cost. Generally, the greater the surface area provided by the process, the more elaborate and expensive the process is. Thus, even stacked capacitors are reaching the limits of usable surface area that can be provided in a cost effective manner.

Consequently, an improved method is needed which forms a capacitor of a large surface area and which forms the capacitor in a manner that occupies a minimum of space on the silicon substrate. In addition, such a method is needed which can be conducted in a simple and cost effective manner.

SUMMARY OF THE INVENTION

A method is provided herein for forming a silicon structure on a semiconductor substrate with a pair of exposed surfaces that are roughened so as to increase the surface area thereon. In one embodiment a capacitor storage node is formed with roughened inner and outer opposing surfaces which together provide increased surface area and increased charge retention.

The method of the present invention initially involves providing a semiconductor substrate and forming thereon a charge conducting region to which the capacitor storage node will be electrically connected. In the embodiment to be discussed, the semiconductor substrate comprises a silicon substrate of a semiconductor wafer and the charge conducting region comprises an active region located on the semiconductor substrate. Also in the embodiment to be discussed, a pair of gate stacks are formed on the silicon substrate, one at either side of the active region, and a polysilicon plug is formed between the gate stacks and in electrical connection with the active region. An insulating layer is formed over the gate stacks, the polysilicon plug, and the active region. The insulating layer is planarized to a height that corresponds to a height to which the capacitor storage node is to extend above the gate stacks. A recess is formed in the insulating layer above the semiconductor substrate where the capacitor is to be formed.

Subsequently under the method of the present invention, a volume of silicon-containing material is formed so as to line the sides and bottom of the recess. In the embodiment being discussed, the volume of silicon-containing material comprises a polysilicon layer that is preferably formed as a blanket layer that partially fills the recess. A portion of the polysilicon layer is also formed on the surface of the insulating layer above the recess. The polysilicon layer is formed with a thickness selected in accordance with a desired thickness of a free-standing wall of the capacitor storage node that is to be formed.

Once the polysilicon layer is formed, a layer of hemispherical grain polysilicon (HSG) or cylindrical grain polysilicon (CSG) is deposited on the surface thereof, preferably with chemical vapor deposition (CVD). The layer of HSG or CSG polysilicon provides a roughened texture of the surface of the layer of polysilicon.

An alternative technique for providing a roughened texture of the surface of the layer of polysilicon is a seed and anneal process. In the seed and anneal process, CVD of a silicon hydride such as silane is used to deposit the silicon hydride upon the surface of the polysilicon layer. A heat treatment process caused the silane to mobilize the silicon material of the silane so as to agglomerate into crystals. The result is a roughened texture.

Next, the portion of the polysilicon layer that was formed on the surface of the insulating layer is removed. To do so, a height reduction process is conducted, and in preparation for the height reduction process, the recess is filled with photoresist or other suitable protective material. The photoresist or other suitable material protects the portion of the polysilicon layer lining the sides and bottom of the recess from being removed or contaminated by the height reduction process. Once the recess is filled with the protective material, the height reduction process is conducted to remove the portion of the polysilicon layer that was formed on the surface of the insulating layer. Preferably, the height reduction process is a planarization process. More preferably, the height reduction process is a chemical-mechanical planarizing (CMP) process. The photoresist or protective material is then removed.

Ions are implanted into the polysilicon layer with an ion implantation process. The ion implantation process is conducted with an implantation energy that implants a substantially higher concentration of ions into an upper portion of the polysilicon layer than it implants into a lower portion of the polysilicon layer. The preferable angle of implantation of the ions with respect to the surface of implantation is as close to ninety degrees (90°), given the limitation of the aspect ratio of a recess into which ion implantation is made. An implantation energy is selected in conjunction with the angle of ion implantation so as to implant ions into the polysilicon layer at a desired implantation depth. The desired implantation depth corresponds to a thickness of a resulting wall of a capacitor storage node that is to be formed from the polysilicon layer.

The ion implantation process is in one embodiment conducted in multiple stages. Ion implantation parameters such as the angle of implantation and the implantation energy are varied between the stages to tailor the resulting ion concentration profile of the implanted portion of the polysilicon layer.

In one embodiment, the insulating layer is removed after the ion implantation process is concluded. Thereafter, an etching process which is selective to implanted silicon-containing material is conducted to remove the lower portion of the polysilicon layer. One etching process which is selective to implanted silicon-containing material comprises immersing the semiconductor wafer in an etchant comprising tetramethyl ammonium hydroxide (TMAH). The TMAH etchant is preferably prepared with a concentration of about 2.5 weight percent TMAH in a solution of deionized water.

The lower portion of the polysilicon layer is removed by the etching process and the upper portion of the polysilicon layer remains in place and forms a free-standing wall that is in electrical communication with the underlying charge conducting region. In the embodiment being discussed, the free-standing wall forms the capacitor storage node. In one embodiment wherein the recess which was formed in the insulating layer is circular, the free-standing wall has a closed cross-sectional shape, such as a circle, an ellipse, an oval, or an annular shape.

Once the capacitor storage node is formed, conventional process flow is followed to complete a capacitor. Briefly, completion of a capacitor involves forming a dielectric layer over the free-standing wall of the storage node and forming a cell plate over the dielectric layer from polysilicon or another charge conducting material.

In an alternate embodiment, the insulating layer is not removed after conducting the ion implantation process. Consequently, once the selective etching process is conducted, a capacitor storage node is formed within the recess in the insulating layer. The dielectric layer and cell plate are then formed in a region of open space between the capacitor storage node and the edges of the recess.

Thus, the method of the present invention forms a capacitor storage node that has roughened inner and outer opposing surfaces which provide increased surface area such that the capacitor storage node occupies minimal space on the silicon substrate of the semiconductor wafer. The method is simple and can maintain conventional throughput and cost levels of the integrated circuit manufacturing process.

These and other features and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIGS. 10A–10D display cross sectional views of the free-standing walls of the storage mode, where the cross sections are taken perpendicularly to the free-standing walls. FIGS. 10A–10C show the outer contours of such cross sections in the forms of a circle (FIG. 10A), ellipse (FIG. 10B), and ovoid or oval (FIG. 10C).

DETAILED DESCRIPTION OF THE PREFERRED EMBODIMENTS

One manner of conducting the method of the present invention is illustrated in FIGS. 1 through 7. In the depicted embodiment, a capacitor storage node is formed with both a roughened inner surface and a roughened outer surface.

Figure 1:
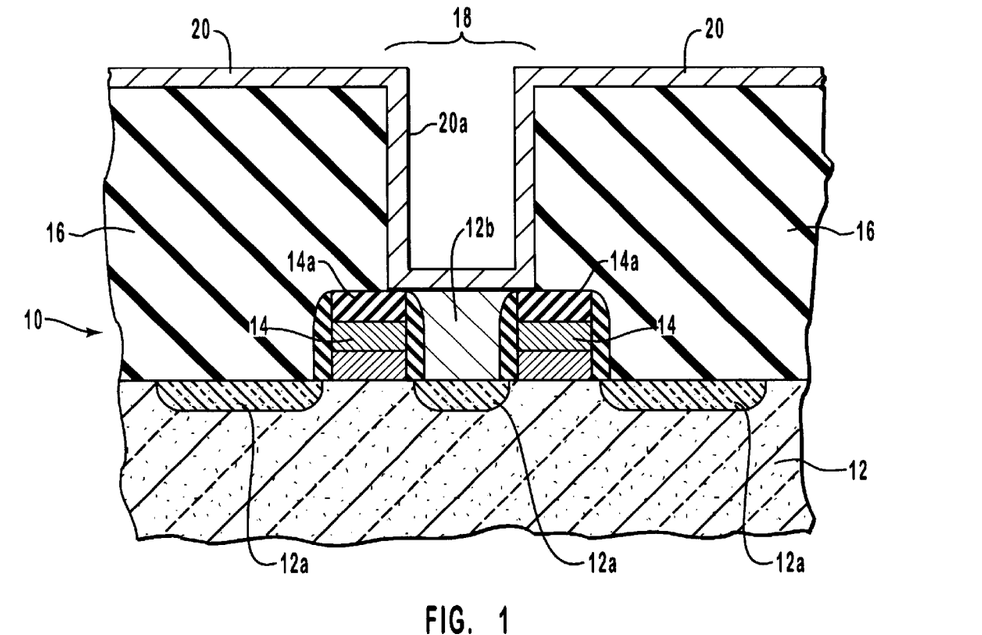
FIG. 1 is a cross-sectional view of a semiconductor wafer showing a recess formed through an insulating layer and extending down to a polysilicon plug situated between two gate stacks, where a polysilicon layer is formed in the recess.

FIG. 1 illustrates an initial step of the method of the present invention in which a semiconductor wafer 10 has situated thereon a silicon substrate 12. A plurality of active regions 12a are formed within silicon substrate 12, one of which has adjacent thereto a pair of gate stacks 14. Formed at the top of each gate stack 14 is a silicon nitride cap 14a.

Also depicted in FIG. 1 is a polysilicon plug 12b formed between gate stacks 14 and contacting one of active regions 12a. Polysilicon plug 12b can be formed in any conventional manner. One method for forming polysilicon plug 12b is described in a copending United States patent application, titled "ION IMPLANTED STRUCTURES AND METHODS OF FORMATION", filed concurrently on the same date herewith, and which will be hereinafter referred to as the "Copending U.S. Patent Application." The Copending U.S. Patent Application is hereby incorporated by reference into this document.

Once polysilicon plug 12b is formed, an insulating layer is formed over the silicon substrate and gate stacks. The insulating layer is preferably composed of borophosphosilicate glass (BPSG), although borosilicate glass (BSG) or phosphosilicate glass (PSG) are also suitable. In the depicted embodiment of FIG. 1, a BPSG layer 16 is the intended insulating layer. Once formed, BPSG layer 16 is thereafter planarized to provide a flat surface thereon. The planarization of BPSG layer 16 is preferably conducted with mechanical planarization, and more preferably, with chemical-mechanical planarization (CMP). The height of BPSG layer 16 after planarization determines the height of the capacitor storage node that is to be formed under the method of the present invention. Accordingly, the thickness with which BPSG layer 16 is deposited and subsequently planarized to is determined in accordance with the desired height of the capacitor storage node.

After forming and planarizing BPSG layer 16, a recess 18 is formed in BPSG layer 16. In the depicted embodiment, recess 18 is formed extending from the surface of BPSG layer 16 down to the tops of silicon nitride caps 14a of gate stacks 14 and polysilicon plug 12a. Recess 18 is formed in a self-aligned manner by forming recess 18 with a diameter that causes recess 18 to partially overlap onto silicon nitride caps 14a of gate stacks 14. Recess 18 is also formed with the use of an etching process that etches BPSG selective to the silicon nitride of silicon nitride caps 14a. Thus, if recess 18 is misaligned slightly to one side, the etching process will still stop at the top of gate stacks 14, and recess 18 will still be formed so as to contact polysilicon plug 12a.

After forming recess 18, a volume of silicon-containing material is formed in recess 18. Preferably, polysilicon will be the silicon-containing material, although other types of silicon-containing material could also be used, one suitable example of which is amorphous silicon. In the depicted embodiment, a polysilicon layer 20 lines the sides and bottom of recess 18. A CVD process is preferably used to deposit polysilicon layer 20 as a blanket layer having a substantially uniform thickness over the surface of BPSG layer 16 as well as within recess 18. Polysilicon layer 20 is preferably formed of intrinsic polysilicon, which is defined herein as polysilicon that is substantially undoped or that is lightly doped. Lightly doped polysilicon is defined herein as polysilicon having an ion dopant concentration of less than about $1 \times 10^{19}$ atoms per $cm^3$. Polysilicon layer 20 is deposited with a selected thickness that determines the amount of open space that will be formed between the side of recess 18 and a free-standing wall of the capacitor storage node to be formed. For instance, forming polysilicon layer 20 with a greater thickness will result in the formation of a greater amount of open space between the side of recess 18 and the free standing wall, while forming polysilicon layer 20 with a lesser thickness will result in the formation of a lesser amount of open space.

Figure 2:
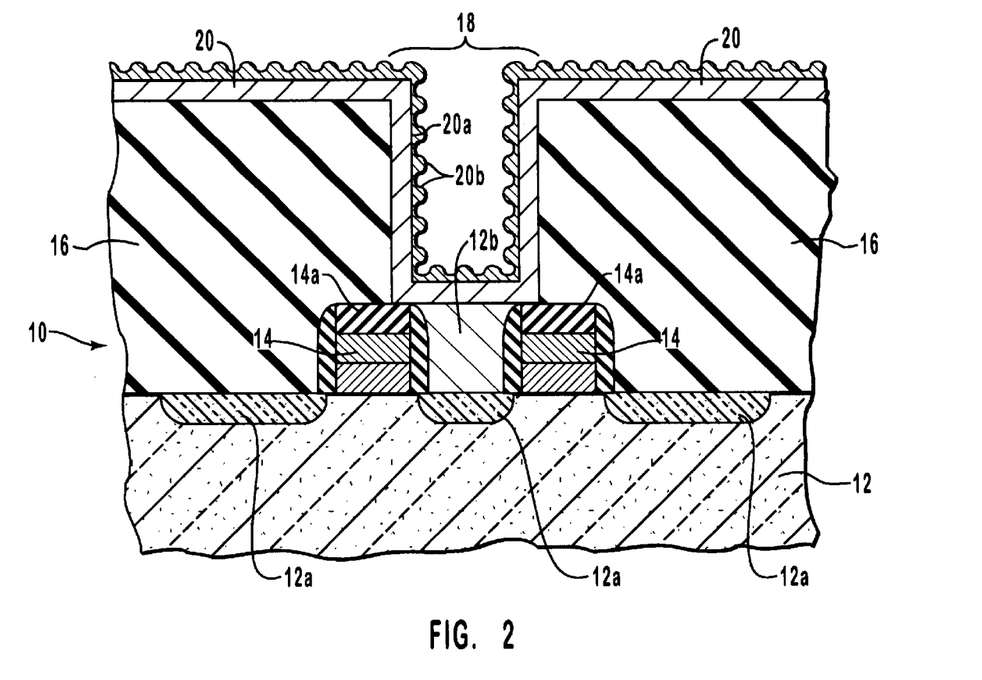
FIG. 2 is a cross-sectional view of the semiconductor wafer of FIG. 1, in which a layer of HSG or CSG polysilicon is formed over the surface of the polysilicon layer.

As shown in FIG. 2, once polysilicon layer 20 is formed, a layer of discrete protruding grains 20b is firmed on a surface 20a of polysilicon layer 20. Discrete protruding grains 20b are preferably hemispherical grain (HSG) polysilicon or cylindrical grain (CSG) polysilicon. Forming discrete protruding grains 20b on the surface of polysilicon layer 20 roughens one surface of polysilicon layer 20 and thereby increases the surface area of the resulting capacitor storage node. The HSG or CSG polysilicon material of the layer of discrete protruding grains 20b is preferably deposited in a conventional manner. Summarily, this comprises depositing a thin undoped or lightly doped layer of amorphous silicon with CVD over polysilicon layer 20 and subsequently high treating the substrate. Heat treating brings about a nucleation of the amorphous silicon layer into the layer of discrete protruding grains 20b.

An alternative technique for providing a roughened texture of surface 20a of polysilicon layer 20 is a seed and anneal process. In the seed and anneal process, CVD of a silicon hydride such as silane is used to deposit the silicon hydride on the surface of polysilicon layer 20. A heat treatment process causes mobilization of the silicon material of the silane so as to agglomerate into crystals. The result is a roughened texture of protruding grains 20b as seen in FIG. 2.

Figure 3:
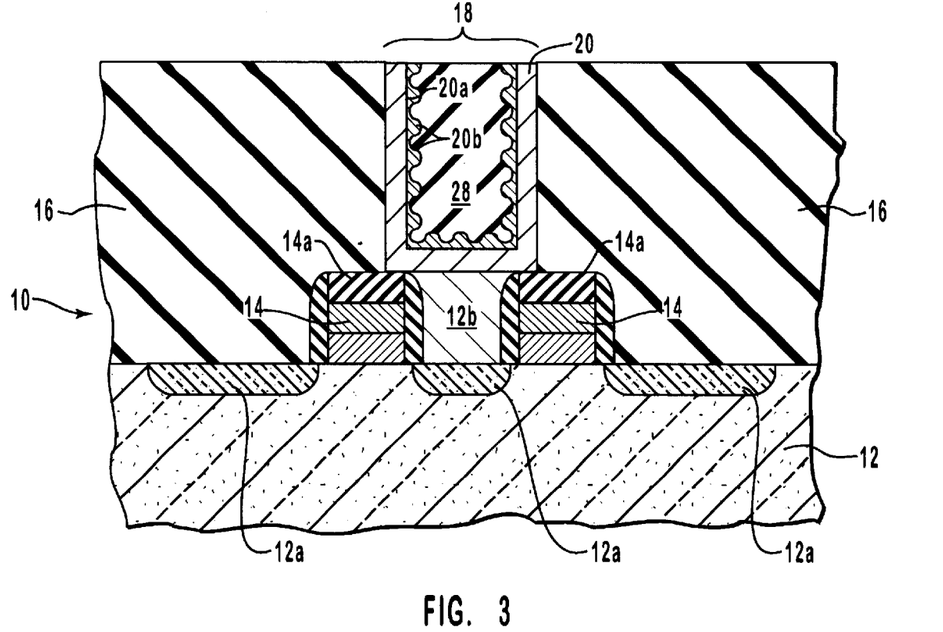
FIG. 3 is a cross-sectional view of the semiconductor wafer of FIG. 2, where the recess is filled with photoresist material and a planarization operation has been conducted to remove a portion of the polysilicon layer that extended above the top of the recess.

As shown in FIG. 3, after discrete protruding grains 20b are formed, a volume of material such as a photoresist plug 28 is applied and patterned to fill recess 18 in preparation for conducting a planarization process. Photoresist plug 28 preserves the interior of recess 18 from damage and contamination during planarization, and is preferably deposited using conventional methods. Once photoresist plug 28 is in place, a planarization process such as CMP is conducted to remove a portion of polysilicon layer 20 of FIG. 2 that extends above BPSG layer 16. After the planarization process is concluded, photoresist plug 28 is removed as shown in FIG. 4.

Figure 4:
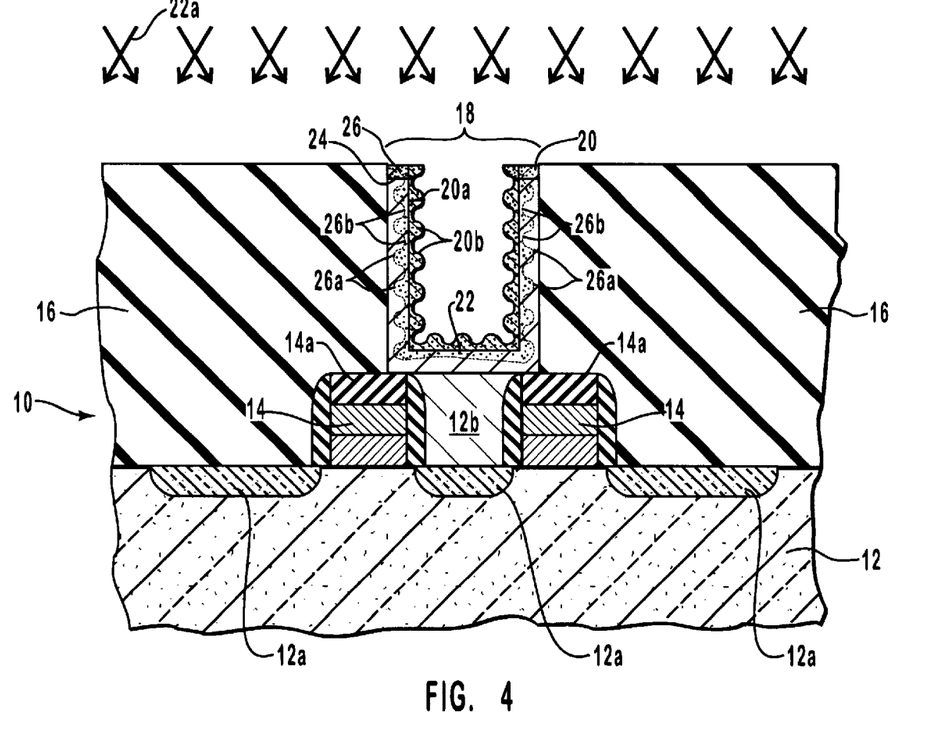
FIG. 4 is a cross-sectional view of the semiconductor wafer of FIG. 3, where ions are implanted into the polysilicon layer.

FIG. 4 shows arrows 22a as ions 22 that are being implanted into polysilicon layer 20. The implantation of ions 22 is conducted with an angle of implantation and an implantation energy selected to result in a desired thickness of a free-standing wall of the resulting storage node. Thus, a flexibility is imparted as to selection of a desired thickness of the free-standing wall. For instance, with respect to the implanted surface, the ion implantation angle that is smaller, or the implantation energy will result in a thicker portion of polysilicon layer 20 being implanted and thus will result in a thicker free-standing wall of the resulting storage node. Selecting a larger implantation angle or a lower implantation energy will result in a thinner portion of polysilicon layer 20 being implanted and thus will result in a thinner free-standing wall of the resulting storage node. Due to this flexibility, the resulting free-standing wall can be of sub-photolithographic resolution width. Sub-photolithographic resolution width is defined herein as about 0.2 microns and less.

The angle of implantation of ions 22 is preferably perpendicular to the surface into which the ions are implanted. Such perpendicularity will effect, in accordance with the inventive method, a mirror image indentation 26b for a corresponding grain 20b across surface 20a of polysilicon layer 20. Any change in implantation angle from the perpendicular will cause a shift in the position of indentation 26b with respect to its corresponding grain 20b across surface 20a of polysilicon layer 20.

When ions are implanted into a high aspect ratio recess, such as recess 18 as seen in FIG. 2, perpendicularity of ions implanted into the surface of implantation is not readily achievable. As such, it is desirable to implant ions into recess 18 with an angle of implantation that is as close to perpendicular to surface 20a as is practical. Such practically is implemented within the confines of the aspect ratio of recess 18. By way of example, recess 18 has void there in that is defined by an exposed surface of grains 20b formed on surface 20a of polysilicon layer 20. The void within recess 18 has a side wall with a height H that extends substantially orthogonally to the top of silicon nitride cap 14a above the top of BPSG layer 16. The side wall of the void within recess 18 intersects substantially orthogonally with a bottom wall of the void within of recess 18 having a width W. As such, the void with recess 18 has an aspect ratio of H/W. Accordingly, it is desirable that ions 22 be implanted into polysilicon layer 20 with a trajectory with a slope not less than about H/W, where slope is measured with respect to the bottom wall of the void within recess 18. As the slope of the trajectory decreases from about H/W, implantation of ions into recess 18 becomes more shallow which is not preferred. As the slope of the trajectory increases from about H/W, implantation of ions into recess 18 becomes less perpendicular to grains 20b on surface 20a of polysilicon layer 20 which is not preferred.

The implantation of ions 22 forms an upper portion 26 of polysilicon layer 20 that is implanted with ions 22 to a selected ion concentration and a lower portion 24 of polysilicon layer 20 is implanted with ions 22 to less than the selected ion concentration. In the depicted embodiment, upper portion 26 forms a closed cross-sectional shape as an inner annular ring around recess 18, and lower portion 24 forms an outer annular ring around recess 18 that encircles upper portion 26.

Discrete protruding grains 20b form a mask which selectively reduces the penetration into polysilicon layer 20 of a portion of ions 22 that impact upon discrete protruding grains 20b. Thus, the energy of the portion of ions 22 that impact upon discrete protruding grains 20b is at least partially absorbed by discrete protruding grains 20b. The portion of ions 22 that impact upon discrete protruding grains 20b is consequently implanted to a lesser depth within polysilicon layer 20 than if the portion of ions 22 had not impacted upon discrete protruding grains 20b. A portion of ions 22 that does not impact upon discrete protruding grains 20b is not impeded and generally penetrates more deeply into polysilicon layer 20 than the portion of ions 22 that does impact upon discrete protruding grains 20b.

As a result of the implantation of ions 22 into polysilicon layer 20, an ion concentration profile is formed in polysilicon layer 20 for any given concentration of ions 22. One ion concentration profile is formed with a selected concentration of ions 22 and corresponds to an outermost boundary 26a of upper portion 26. In the depicted embodiment, the selected ion concentration is about $1 \times 10^{19}$ ions per cubic centimeter of silicon-containing material. As a consequence of the implantation of ions 22 to differing depths, upper portion 26 is formed with a thickness between surface 20a of polysilicon layer 20 and outermost boundary 26a that repeatedly increases and decreases at consecutive locations along upper portion 26.

Outermost boundary 26a is formed with alternating indentations 26b at locations wherein ions 22 were impeded in momentum by protruding grains 20b. Consequently, most indentations 26b are formed on an opposite side of polysilicon layer 20 from a corresponding one of discrete protruding grains 20b. As such, each of the opposing substantially non-planar surfaces of polysilicon layer 20 has a plurality of indentations and protrusions, wherein each indentation on one of the opposite sides has a corresponding protrusion on the other of the opposite sides. Similarly, each protrusion on one of the opposite sides has a corresponding indentation on the other of the opposite sides. The appearance of each of the opposing substantially non-planar surfaces of polysilicon layer 20 is substantially an impression image pattern of the other. Of course, when ions 22 are implanted at an angle other than orthogonal to surface 20a of polysilicon layer 20 as in the depicted embodiment, each indentation 26b will be slightly displaced opposite of surface 20a from a corresponding one of discrete protruding grains 20b according to the trajectory angle of ions 22. For instance, in the depicted embodiment, ions 22 have a downward trajectory, and accordingly, most of indentations 26b are formed across surface 20a from and slightly below a corresponding one of discrete protruding grains 20b.

Figure 5:
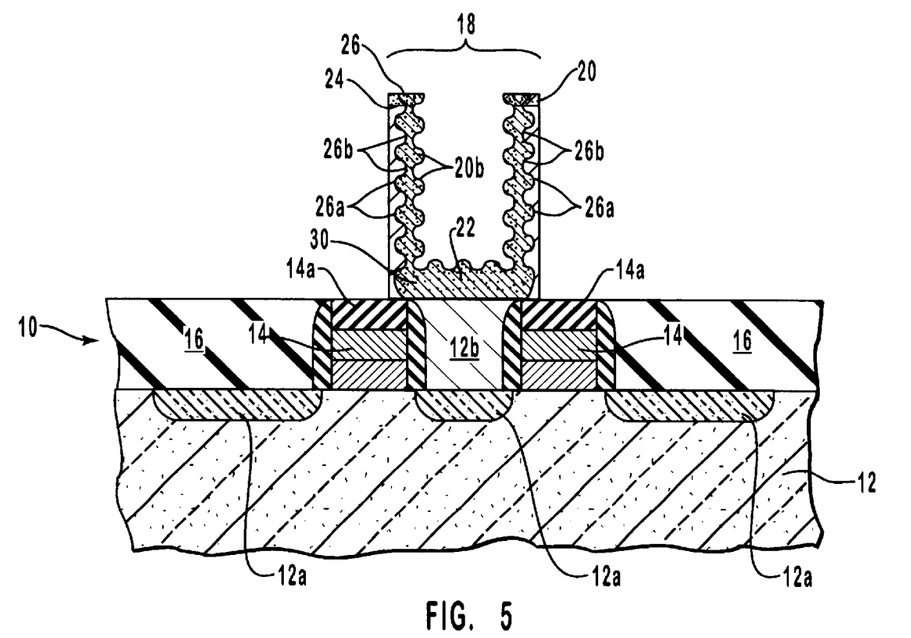
FIG. 5 is a cross-sectional view of the semiconductor wafer of FIG. 4, where the insulating layer is partially removed.

As shown in FIG. 5, in one embodiment of method of the present invention, BPSG layer 16 is removed after the ion implantation process is conducted. Removal of BPSG layer 16 can be accomplished with any suitable material removal process that removes insulating material selective to polysilicon.

After BPSG layer 16 is partially removed, an etching process which etches unimplanted silicon-containing material selective to implanted silicon-containing material is conducted. Preferably, polysilicon layer 20 is etched so that the unimplanted portion thereof has a material removal rate that is at least two times greater than that of the implanted portion. Several manners of conducting such an etching process are disclosed in the Copending U.S. Patent Application, which has been incorporated by reference into this document. One presently preferred etching process using an etchant comprising tetramethyl ammonium hydroxide (TMAH). In using the TMAH etching process, polysilicon layer 20 is exposed to a TMAH etchant preferably administered in a solution with deionized water.

A preferred concentration of TMAH in the solution is from about 0.1 weight percent and higher. A more preferred concentration is in a range from about 1 to about 10 weight percent TMAH in the solution, and a most preferred concentration is about 2.5 weight percent TMAH in the solution. The TMAH etching process is preferably conducted at a temperature in a range from about 5° C. to about 50° C., and more preferably, in a range from about 20° C. to about 30° C. Most preferably, the TMAH etching process is conducted at a temperature of about 30° C.

The TMAH etching process does not require a specific dopant, and is not reliant upon an activation or diffusion of the implanted ions with a heat treatment operation. Thus, conducting a heat treatment operation is optional. The heat treatment operation, usually conducted as an anneal, typically diffuses the ions laterally, which rearranges the implantation concentration profile and may thus be undesirable. Rearrangement of the implantation concentration profile may reduce the selectivity of the etch and may reduce control over the dimensions of the etched structure, such as upper portion 26 seen in FIGS. 5 and 6. Conducting the TMAH etching process without annealing results in a sharper ion concentration profile, which is often more desirable than the diffusion of ions that results from a heat treatment operation. As such, it is preferable to hold the semiconductor substrate within a selected temperature range after ion implantation and until the TMAH etch process so as to avoid ion diffusion.

The implanted silicon-containing material is preferably implanted with a selected ion concentration of ions 22 in upper portion 26 that is in a range from about $1 \times 10^{15}$ ions per $cm^3$ of silicon-containing material to about $1 \times 10^{22}$ ions per $cm^3$ of silicon-containing material. More preferably, upper portion 26 is implanted with ions 22 to a selected concentration that is in a range from about $1 \times 10^{19}$ ions per $cm^3$ of silicon-containing material to about $5 \times 10^{19}$ ions per $cm^3$ of silicon-containing material. Most preferably, upper portion 26 is implanted with ions 22 to a concentration of about $1 \times 10^{19}$ ions per $cm^3$ of silicon-containing material. Implanting to a concentration of over $1 \times 10^{19}$ ions per $cm^3$ of silicon-containing material is acceptable under the present invention, but the excess concentration of ions 22 has not been found to substantially increase the selectivity to implanted portions of the silicon-containing material.

Preferably, lower portion 24 is implanted to a concentration of ions 22 that is substantially lower than the selected ion concentration, and most preferably, lower portion 24 is relatively unimplanted with ions 22.

When conducting the TMAH etching process, traditional dopant ions that are known to change the electrical properties of polysilicon layer 20 can be utilized in the ion implantation operation. A preferred type of dopant ion for which satisfactory results have been observed is phosphorous. Arsenic and boron are also preferred types of dopant ions. Other types of ions including the Group IIIA and VA elements can also be selected. For instance, inert gases that do not have a bond to be filled or an electron to give out are a preferred type of ions. It is contemplated that any type of ion that can be bombarded into a volume of silicon-containing material can be used in conjunction with the suggested etching process which is selective to implanted ions. Accordingly, inert types of ions that do not alter the electrical characteristics of the silicon-containing material such as argon and silicon can also be used.

A beneficial aspect of the inventive method is that a heat treatment operation is neither necessary nor desirable after ion implantation. Heat treatment operation, usually conducted as an anneal, typically diffuses ions 22 laterally, which rearranges the ion concentration profile of the implanted ions. Diffusion of ions 22 is undesirable in that it reduces control over the shape of the ion concentration profile, and thus the resulting ion implanted silicon structure after the etch process. As such, conducting the etching unimplanted silicon-containing material process selective to implanted silicon-containing material, without an anneal, results in a sharper ion concentration profile. The sharper ion concentration profile provides a rougher surface than does the ion diffusion that results from a heat treatment operation.

The suggested TMAH etching process has a selectivity to implanted silicon-containing material that results in relatively unimplanted silicon-containing material being etched at least two times faster than substantially implanted silicon-containing material. Under proper conditions, a selectivity of 20 to one can be obtained. Selectivities of 40 to one (40:1), and up to 60 to one (60:1) can be obtained through proper selection of the ion implantation parameters. Thus, lower portion 24 which was only lightly implanted or which was relatively unimplanted is etched quickly compared to upper portion 26. After lower portion 24 is removed, upper portion 26 which was implanted to at least $1 \times 10^{15}$ dopant ions per $cm^3$ of silicon-containing material is exposed after the etch. Once lower portion 24 is removed, the material removal rate of the etching process which is selective to implanted silicon-containing material is significantly slowed down due to the inherent selectivity to the highly implanted polysilicon of upper portion 26. Consequently, a broad process window is provided for properly stopping the etching process without removing a significant amount of ion implanted polysilicon from upper portion 26.

Of course, other satisfactory etchants can be added that also remove unimplanted silicon-containing material at a faster rate than implanted silicon-containing material. For instance, basic solutions can be employed, one example of which is potassium hydroxide (KOH).

Figure 6:
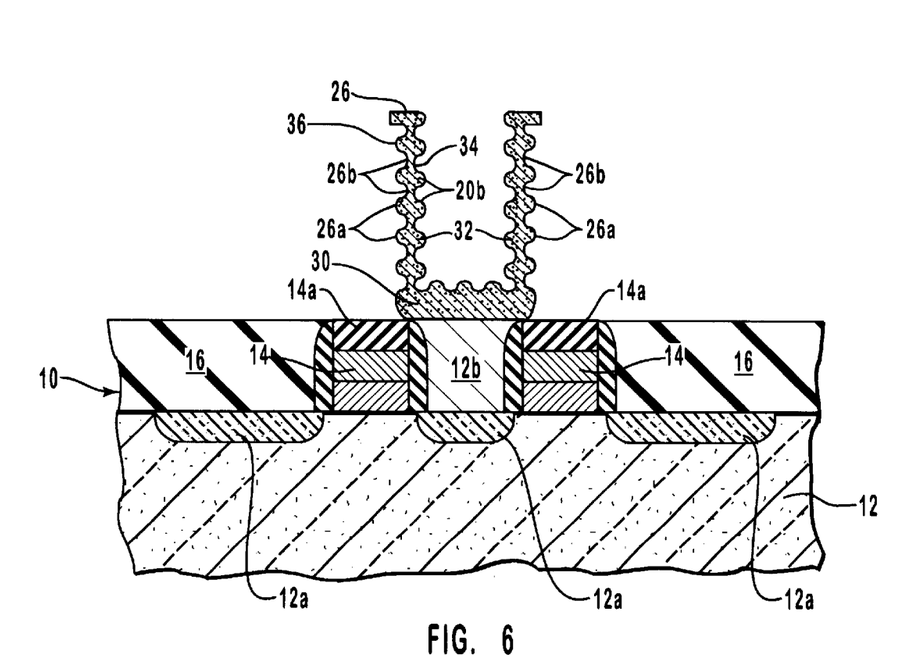
FIG. 6 is a cross-sectional view of the semiconductor wafer of FIG. 5, in which an etching process selective to implanted silicon-containing material is conducted to remove a portion of the polysilicon layer and to form thereby a free-standing wall with opposing roughened surfaces.

As shown in FIG. 6, the result of the suggested etching process is that lower portion 24 is removed and upper portion 26 is substantially left remaining to form a storage node 30 including a free-standing wall 32 projecting above gate stacks 14. In the depicted embodiment, recess 18 is substantially circular, and consequently, free-standing wall 32 is substantially annular in shape. Free-standing wall 32 of storage node 30 is formed with an inner surface 34 and an outer surface 36. Inner surface 34 comprises discrete protruding grains 20b which give a roughened texture to polysilicon layer 20. Outer surface 36 is formed at approximately the location of outermost boundary 26a of upper portion 26. Indentations 26b of free-standing wall 32 are thereby formed in surface 36, most of which are located approximately across surface 20a from a corresponding one of discrete protruding grains 20b, and thus provide a roughened texture on outer surface 36 of free-standing wall 32. As such, outer surface 36 has a topography that is substantially an impression image of the topography of the inner surface 34. Due to its roughened surfaces, free-standing wall 32 has opposing substantially non-planar surfaces.

Free-standing wall 32 can be formed with configurations other than that which is shown, and can be employed in applications other than for use as a capacitor storage node. As defined herein, a free-standing wall is an electrically conductive structure having opposing surfaces, the structure extending substantially orthogonally from a base, each opposing surface of the structure being out of contact with other electrically conducting materials over a substantial portion thereof.

Figure 7:
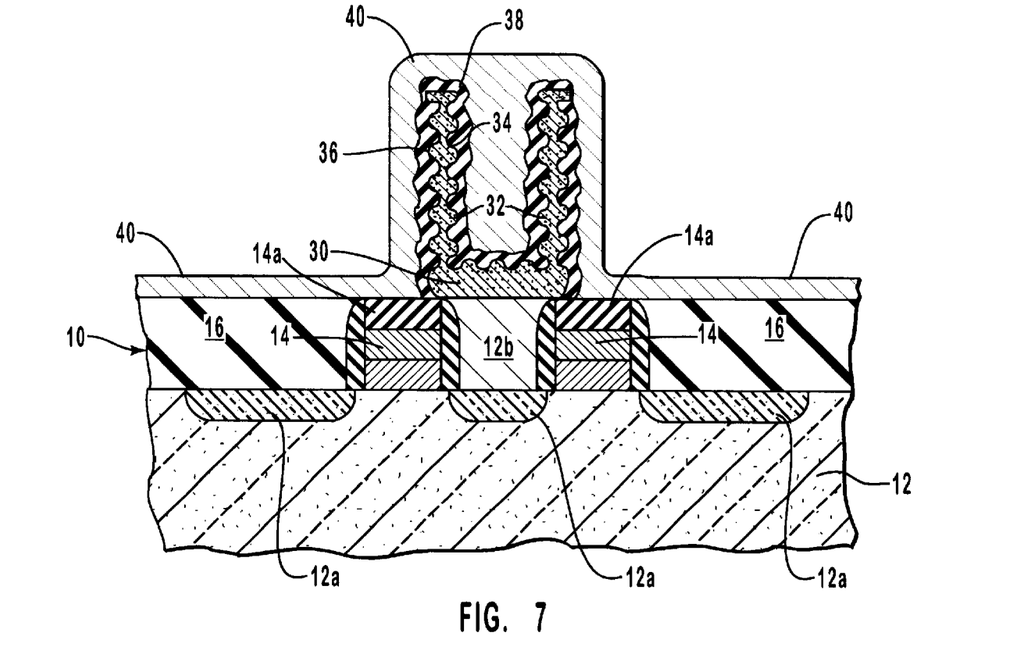
FIG. 7 is a cross-sectional view of the semiconductor wafer of FIG. 6, in which a dielectric layer is deposited over the free-standing wall and in which a cell plate is formed over the dielectric layer to complete a capacitor.

Further steps of the method of the present invention are shown in FIG. 7, wherein conventional capacitor formation process flow is performed to complete fabrication of a capacitor. Thus, as shown in FIG. 7, once storage node 30 is formed, a thin dielectric layer 38 is conventionally formed over storage node 30, after which a cell plate 40 is conventionally formed thereover.

Figure 8:
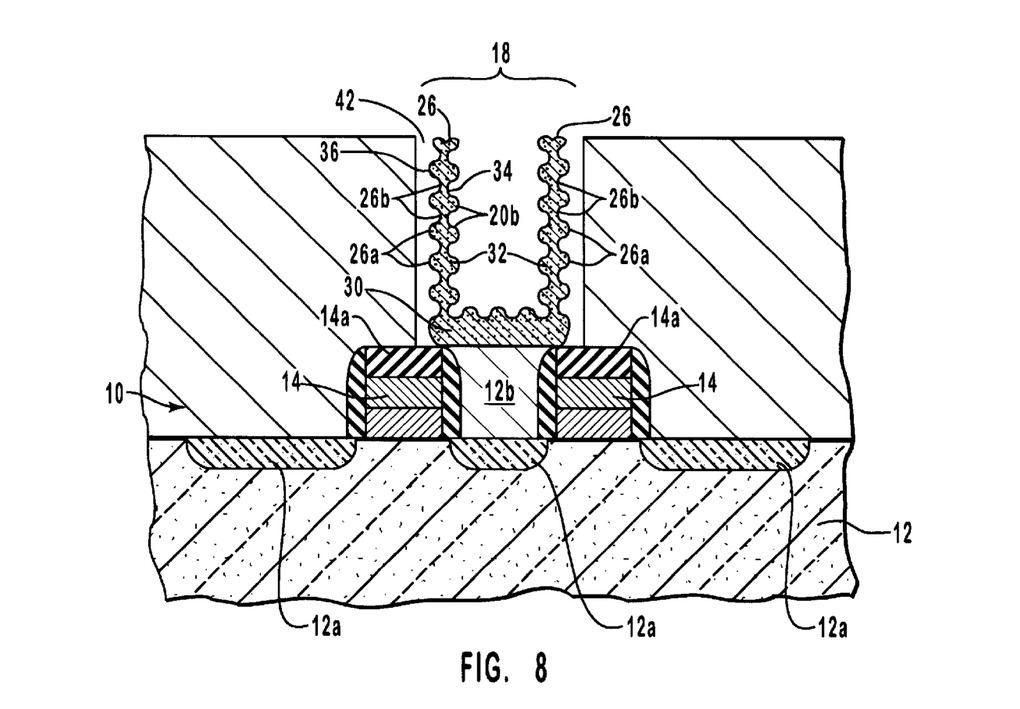
FIG. 8 is a cross-sectional view of the semiconductor wafer of FIG. 4 showing a procedure in an alternate embodiment of the method of the present invention in which an etching process which is selective to implanted silicon-containing material is conducted to remove the inner portion of the polysilicon layer and to form thereby a free-standing wall within a recess in the insulating layer.
Figure 9:
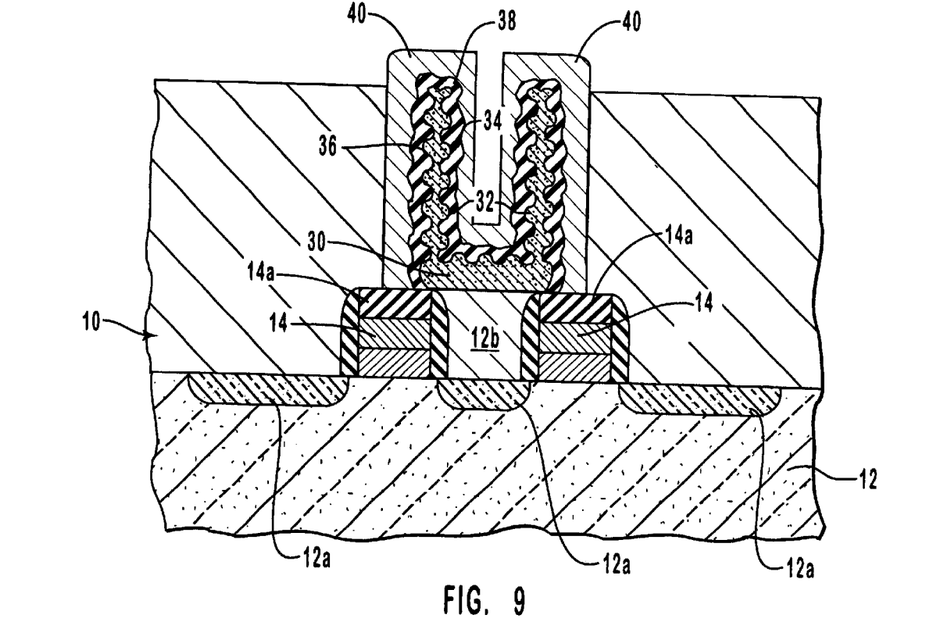
FIG. 9 is a cross-sectional view of the semiconductor wafer of FIG. 8, showing a further procedure of the alternate embodiment of the method of the present invention in which a dielectric layer is deposited over the free-standing wall and in which a cell plate is formed over the dielectric layer to complete a capacitor.
Figure 10A:
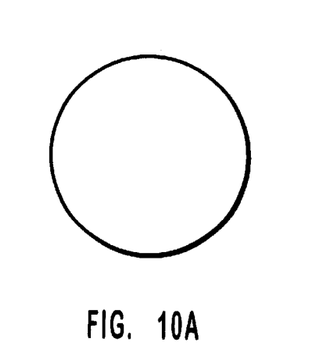
Figure 10B:
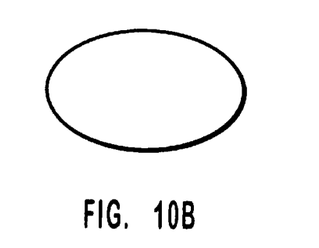
Figure 10C:
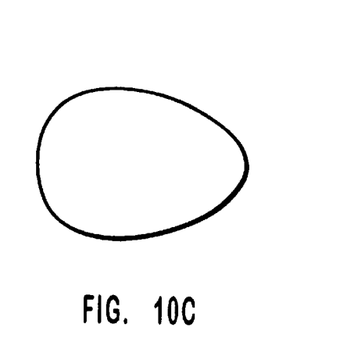
Figure 10D:
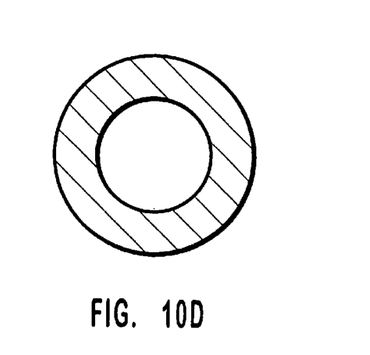
FIG. 10D shows an annular cross section.

An alternate embodiment of the method of the present invention is shown in FIGS. 8 and 9. In the embodiment of FIGS. 8 and 9, the ion implantation process represented by 22a in FIG. 4 is performed earlier in the process flow. As such, arrows 22a show ions 22 as being implanted into polysilicon layer 20 at the stage of FIG. 2. Particularly, ion implantation 22a is performed after the structure seen in FIG. 2 has been formed. After ion implantation 22a, photoresist 28 fills recess 18 and a CMP process is performed so as to achieve the structure seen in FIG. 3. Next, the unimplanted silicon-containing material etching process which is selective to implanted silicon-containing material is conducted in substantially the same manner as described above. The etching process forms a capacitor storage node 30 that has a free-standing wall 32 which is roughened on two opposing sides as shown in FIG. 8.

Differences exits between the embodiment seen in FIG. 8 and the embodiment seen in FIG. 6. In FIG. 6, the top most grain and indentation 20b, 26b are larger in size than that seen in FIG. 8. The reason for this difference is that similar top most large grains and indentations were removed in the alternative embodiment by the CMP following ion implantation, whereas the CMP precedes ion implantation in the first embodiment. Additionally, in the embodiment of FIGS. 8 and 9, free-standing wall 32 is formed within recess 18 and is separated from BPSG layer 16 by an open area 42. Consequently, a capacitor can be formed within recess 18 without the need for subsequent deposition of an insulating layer and the aforementioned requisite planarization of the insulating layer. Thus, as shown in FIG. 9, once capacitor storage node 30 is formed, a dielectric layer 38 is conventionally formed over capacitor storage node 30 in open area 42 and a cell plate 40 is conventionally formed over dielectric layer 38 to the extent of open area 42, all of which are contained within recess 18.

The method of the present invention provides several advantages over the prior art. For instance, a free-standing wall of a capacitor storage node is formed thereby that has roughened opposing inner and outer surfaces in order to provide an increased surface area and a consequent high charge retention. Even with an increased surface area, the capacitor storage node occupies only a minimal amount of surface space above the semiconductor substrate. The method of the present invention also provides flexibility as to the thickness with which the free-standing wall of the capacitor storage node is formed, allowing the free-standing wall to be formed with sub-photolithography resolution width as a benefit to component miniaturization. In addition, these benefits are achieved with a method that is simple, and which maintains a high integrated circuit manufacturing process throughput and a corresponding low cost.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A memory structure comprising:
   a semiconductor substrate;
   a contact plug;
   a storage node formed over the semiconductor substrate and composed of a layer of polysilicon on a surface of a volume of silicon-containing material, the layer of polysilicon being composed of at least one of HSG polysilicon and CSG polysilicon, the volume of silicon-containing material being in contact with said contact plug and having an ion concentration therein that is in a range from about $1 \times 10^{15}$ ions per $cm^3$ of silicon-containing material to about $1 \times 10^{22}$ ions per $cm^3$ of silicon-containing material, wherein said ion concentration presents an ion concentration gradient through said silicon-containing material, said storage node comprising:
      a base in contact with said contact plug; and
      a free-standing wall extending from said base and having opposing non-planar surfaces, wherein said free-standing wall is provided with a shape that is partly determined by said ion concentration gradient;
   a dielectric layer upon said storage node; and
   an electrically conductive cell plate upon said dielectric layer.

2. The memory structure as defined in claim 1, further comprising a contact plug in contact with:
   the semiconductor substrate; and
   the volume of silicon-containing material.

3. The memory structure as defined in claim 2, further comprising:
   a pair of gate regions on the semiconductor substrate;
   an active region within the semiconductor substrate in between and adjacent to the pair of gate stacks and in electrical connection with the contact plug, said contact plug being situated in between and adjacent to the pair of gate stacks.

4. The memory structure as defined in claim 1, wherein the opposing non-planar surfaces of the free-standing wall has a plurality of indentations and protrusions, wherein each said indentation on one of said opposing non-planar surfaces having a corresponding one of said protrusions on the other of said opposing non-planar surfaces, and wherein each said protrusion on one of said opposing non-planar surfaces has a corresponding one of said indentations on the other of said opposing non-planar surfaces.

5. A memory structure comprising:
   a pair of gate stacks on a semiconductor substrate;
   an active region within the semiconductor substrate in between and adjacent to the pair of gate stacks;

a contact plug in electrical contact with the active region, and in between and adjacent to the pair of gate stacks;

a layer of insulating material over the pair of gate stacks and the contact plug;

a recess in the layer of insulating material extending to the contact plug;

a storage node formed from a volume of silicon-containing material that is within said recess upon said layer of insulating material and upon said contact plug, wherein said storage node is in contact with said contact plug, said volume of silicon-containing material having an ion concentration therein that is a range from about $1 \times 10^{15}$ ions per $cm^3$ of silicon-containing material to about $1 \times 10^{22}$ ions per $cm^3$ of silicon-containing material, wherein said ion concentration presents an ion concentration gradient through said silicon-containing material, said storage node having a base and a free-standing wall extending from said base, said free-standing wall having opposing non-planar surfaces, wherein said free-standing wall is provided with a shape that is partly determined by said ion concentration gradient;

a layer of polysilicon on a surface of the volume of silicon-containing material, the layer of polysilicon being composed of at least one of HSG polysilicon and CSG polysilicon;

a dielectric layer upon said storage node; and an electrically conductive cell plate upon said dielectric layer.

6. The memory structure as defined in claim 5, wherein the opposing non-planar surfaces of said free-standing wall has a thickness therebetween that varies non-linearly.

7. The memory structure as defined in claim 5, wherein the opposing non-planar surface of the free-standing wall has a plurality of indentations and protrusions, wherein each said indentation on one of said opposing non-planar surfaces having a corresponding one of said protrusions on the other of said opposing non-planar surfaces, and wherein each said protrusion on one of said opposing non-planar surfaces has a corresponding one of said indentations on the other of said opposing non-planar surfaces.

8. In a circuit that includes a pair of gate stacks on a semiconductor substrate with an active region within the semiconductor substrate in between and adjacent to the pair of gate stacks, and a contact plug in electrical contact with the active region, and in between and adjacent to the pair of gate stacks, a memory structure comprising:

a layer of insulating material over the pair of gate stacks and the contact plug;

a recess in the layer of insulating material extending to the contact plug;

a storage node composed of a volume of silicon-containing material within said recess upon said layer of insulating material and upon said contact plug, said volume of silicon-containing material having an ion concentration in a range from about $1 \times 10^{15}$ ions per $cm^3$ of silicon-containing material to about $1 \times 10^{22}$ ions per $cm^3$ of silicon-containing material, wherein said ion concentration presents an ion concentration gradient through said silicon-containing material, said storage node including a base and a free-standing wall extending from said base, wherein said free-standing wall is provided with a shape that is partly determined by said ion concentration gradient;

at least one of HSG polysilicon and CSG polysilicon upon a surface of the storage node, said layer of insulating material being out of contact with said at least one of HSG polysilicon and CSG polysilicon;

a dielectric layer upon said storage node; and an electrically conductive cell plate upon said dielectric layer.

9. The memory structure as defined in claim 8, wherein the free-standing wall has opposing non-planar surfaces.

10. The memory structure as defined in claim 9, wherein the opposing non-planar surfaces of the free-standing wall has a thickness therebetween that varies non-linearly.

11. The memory structure as defined in claim 9, wherein the opposing non-planar surfaces of the free-standing wall has a plurality of indentations and protrusions, wherein each said indentation on one of said opposing non-planar surfaces having a corresponding one of said protrusions on the other of said opposing non-planar surfaces, and wherein each said protrusion on one of said opposing non-planar surfaces has a corresponding one of said indentations on the other of said opposing non-planar surfaces.

12. A memory structure comprising:

a pair of gate regions on a semiconductor substrate;

an active region within the semiconductor substrate in between and adjacent to the pair of gate stacks;

a contact plug in electrical connection with the active region, the contact plug being situated in between and adjacent to the pair of gate stacks;

a storage node composed of a layer of polysilicon on a surface of a volume of silicon-containing material, the layer of polysilicon being composed of at least one of HSG polysilicon and CSG polysilicon, the volume of silicon-containing material being in contact with said contact plug and being implanted with ions to a concentration in a range from about $1 \times 10^{15}$ ions per $cm^3$ of silicon-containing material to about $1 \times 10^{22}$ ions per $cm^3$ of silicon-containing material, wherein said ion concentration presents an ion concentration gradient through said silicon-containing material, said storage node comprising:

a base in contact with said contact plug; and an free-standing wall extending from said base and having opposing nonplanar surfaces, wherein said free-standing wall is provided with a shape that is partly determined by said ion concentration gradient;

a dielectric layer upon said storage node; and an electrically conductive cell plate upon said dielectric layer.

13. The memory structure as defined in claim 12, wherein each of the opposing nonplanar surfaces of the free-standing wall has a plurality of indentations and protrusions, wherein each said indentation on one of said opposing nonplanar surfaces having a corresponding one of said protrusions on the other of said opposing non-planar surfaces, and wherein each said protrusion on one of said opposing non-planar surfaces has a corresponding one of said indentations on the other of said opposing nonplanar surfaces.

14. The memory structure as defined in claim 12, wherein the cross-section taken perpendicularly to the free-standing wall is closed.

15. The memory structure as defined in claim 14, wherein the closed cross-seetional section has a shape selected from the group consisting of a circle, an ellipse, an oval, and an annular shape.

* * * * *

UNITED STATES PATENT AND TRADEMARK OFFICE
CERTIFICATE OF CORRECTION

PATENT NO. : 6,255,687 B1
DATED : July 3, 2001
INVENTOR(S) : Thomas A. Figura; Zhiquiang Wu; Li Li It is certified that error appears in the above-identified patent and that said Letters Patent is hereby corrected as shown below:

Title page,
ABSTRACT, line 22, change "roughened" to -- roughen --

Column 1,
Line 19, after "thereof" insert -- . --

Column 7,
Line 51, before "void" insert -- a --
Line 51, change "there in" to -- therein --
Line 58, before "recess" delete [of]

Column 9,
Line 11, change "using" to -- uses --

Column 11,
Line 40, after "Differences" change "exits" to -- exist --

Column 12,
Line 57, change "has" to -- have --
Line 59, change "having" to -- has --

Column 13,
Line 35, after "non-planar" change "surface" to -- surfaces --
Line 36, change "has" to -- have --
Line 38, change "having" to -- has --

UNITED STATES PATENT AND TRADEMARK OFFICE
CERTIFICATE OF CORRECTION

PATENT NO. : 6,255,687 B1
DATED : July 3, 2001
INVENTOR(S) : Thomas A. Figura; Zhiquiang Wu; Li Li It is certified that error appears in the above-identified patent and that said Letters Patent is hereby corrected as shown below:

<u>Column 14,</u>
Line 11, change "has" to -- have --
Line 14, change "has" to -- have --
Line 16, change "having" to -- has --
Line 43, before "free-standing" change "an" to -- a --
Line 54, change "having" to -- has --

Signed and Sealed this

Nineteenth Day of March, 2002

Attest:

JAMES E. ROGAN
*Director of the United States Patent and Trademark Office*

*Attesting Officer*